(12) United States Patent
Houston (10) Patent No.: US 8,891,288 B2
(45) Date of Patent: Nov. 18, 2014

(54) 8T SRAM CELL WITH ONE WORD LINE

(71) Applicant: Texas Instruments Incorporated, Dallas, TX (US)

(72) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/866,369

(22) Filed: Apr. 19, 2013

(65) Prior Publication Data

US 2013/0229859 A1     Sep. 5, 2013

Related U.S. Application Data

(62) Division of application No. 13/476,672, filed on May 21, 2012, now abandoned, which is a division of application No. 12/782,941, filed on May 19, 2010, now Pat. No. 8,203,867.

(60) Provisional application No. 61/180,318, filed on May 21, 2009.

(51) Int. Cl.
    *G11C 11/00*          (2006.01)
    *G11C 11/419*       (2006.01)
    *G11C 11/412*       (2006.01)

(52) U.S. Cl.
    CPC ............ *G11C 11/419* (2013.01); *G11C 11/412* (2013.01)
    USPC ............... 365/154; 365/189.011; 365/189.14; 365/226

(58) Field of Classification Search
    CPC ............ G11C 11/401; G11C 11/4063; G11C 11/4091
    USPC ....................... 365/154, 189.011, 189.14, 226
    See application file for complete search history.

(56) References Cited

U.S. PATENT DOCUMENTS

| | | | |
|---|---|---|---|
| 5,657,292 A | 8/1997 | McClure | |
| 5,777,935 A | 7/1998 | Pantelakis et al. | |
| 7,701,801 B2 * | 4/2010 | Joshi et al. | ............... 365/230.08 |
| 8,295,073 B2 | 10/2012 | Norman | |
| 2009/0175070 A1 * | 7/2009 | Houston | ....................... 365/154 |
| 2011/0019464 A1 * | 1/2011 | McMullan et al. | ........... 365/156 |
| 2012/0014195 A1 | 1/2012 | Deng et al. | |

\* cited by examiner

*Primary Examiner* — Han Yang
(74) *Attorney, Agent, or Firm* — Rose Alyssa Keagy; Frederick J. Telecky, Jr.

(57) ABSTRACT

An integrated circuit with SRAM cells containing dual passgate transistors and a read buffer, all connected to one word line is disclosed. The read buffer and one passgate transistor may be variously configured to a separate read data line and write data line, or a combined data line, in different embodiments. The read buffer in addressed SRAM cells may be biased during read operations. The read buffer in half-addressed SRAM cells may be biased or floated, depending on the configuration of the read data line and the write data line. The read buffer in addressed and half-addressed SRAM cells may be biased or floated, depending on the configuration of the read data line and the write data line.

5 Claims, 8 Drawing Sheets

8T SRAM CELL WITH ONE WORD LINE

CROSS-REFERENCE TO RELATED APPLICATIONS

This application is a divisional of U.S. patent application Ser. No. 13/476,672 filed May 21, 2012, which is a divisional of U.S. patent application Ser. No. 12/782,941 filed May 19, 2010, which claims priority, under U.S.C. §119(e), to U.S. Provisional Application 61/180,318 (entitled "An 8T SRAM Cell With A Single WL"), filed May 21, 2009, the contents of which are incorporated herein by reference.

Furthermore, this application is related to:

Patent application Ser. No. 12/782,908 (filed May 19, 2010) entitled "8T SRAM Cell With Four Load Transistors,"

Patent application Ser. No. 12/782,874 (filed May 19, 2010) entitled "6T SRAM Cell With Single Sided Write,"

Patent application Ser. No. 12/782,894 (filed May 19, 2010) entitled "Asymmetric SRAM Cell With Split Transistors On The Strong Side,"

Patent application Ser. No. 12/782,902 (filed May 19, 2010) entitled "8T SRAM Cell With Two Single-Sided Ports," and Patent application Ser. No. 12/782,927 (filed May 19, 2010) entitled "SRAM Cell for Single Sided Write."

With their mention in this section, these patent applications are not admitted to be prior art with respect to the present invention.

FIELD OF THE INVENTION

This invention relates to the field of integrated circuits. More particularly, this invention relates to static random access memories (SRAMs) in integrated circuits.

DETAILED DESCRIPTION

Example embodiments described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide an understanding of the example embodiments. One skilled in the relevant art, however, will readily recognize that embodiments can be practiced without one or more of the specific details or with other methods. In other instances, well-known structures or operations are not shown in detail to avoid obscuring an embodiment. The example embodiments are not limited by the illustrated ordering of acts or events, as some acts may occur in different orders and/or concurrently with other acts or events. Furthermore, not all illustrated acts or events are required to implement a methodology in accordance with an embodiment.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

For the purposes of this disclosure, the term "Vtn" is understood to mean an average threshold voltage of NMOS transistors in inverters of SRAM cells. The term "Vtp" is understood to mean an average threshold voltage magnitude of PMOS transistors in inverters of SRAM cells.

In this disclosure, the term "driver transistor" is understood to refer to a metal oxide semiconductor (MOS) transistor (possibly a finFET transistor or a carbon nanotube transistor (CNT)) in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor; that is, SRAM cells in arrays which pre-charge data lines to a high voltage have NMOS driver transistors, while SRAM cells in arrays which pre-charge data lines to a low voltage have PMOS driver transistors.

Similarly, the term "load transistor" is understood to refer to another MOS transistor (possibly a finFET transistor or a CNT) in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS load transistors or Vss for NMOS load transistors. A polarity of the load transistor source node power supply is the same as the polarity of a read operation pre-charge potential of a corresponding data line which is connected to the driver transistor through a passgate transistor; that is, SRAM cells in arrays which pre-charge data lines to a potential above Vss have PMOS load transistors, while SRAM cells in arrays which pre-charge data lines to a potential below Vdd have NMOS load transistors.

The term "passgate transistor" is understood to refer to yet another MOS transistor (possibly a finFET transistor or a CNT) in the SRAM cell A source/drain node is connected to a data node of the SRAM cell and an opposite source/drain node is connected to a corresponding data line of the SRAM cell. Similarly, the term "access transistor" is understood to refer to an MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

The term "word line" is understood to mean an interconnect element connected to gate nodes of passgate transistors and/or access transistors in a row of SRAM cells. The terms "bit line" and "bit-bar line" are understood to refer to data lines connected to passgate transistors or read buffers in a column of SRAM cells.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while a bit line is disconnected from read or write circuitry.

In some instances of integrated circuits containing SRAM cell arrays, substantially all circuits in the integrated circuit are dedicated to operation of the SRAM array. In these instances, the circuits which provide data to be stored in the SRAM array and the circuits which use data from the SRAM array are located outside the integrated circuit containing the SRAM array. In other instances of integrated circuits containing SRAM cell arrays (such as microprocessors, digital signal processors and wireless telephony controllers), the circuits which provide data to be stored in the SRAM array and the circuits which use data from the SRAM array are located in the integrated circuit containing the SRAM array.

An integrated circuit may contain an array of SRAM cells arranged in rows and columns. Each SRAM cell contains cross-coupled inverters with a bit-side data node and a bit-bar-side data node, passgate transistors connected to the data nodes, and a read buffer. The passgate transistors and the read buffer are connected to a word line. The read buffer and one passgate transistor may be variously coupled to a separate read data line and write data line, or a combined data line in different embodiments. The read buffer in addressed SRAM cells may be biased during read operations. The read buffer in half-addressed SRAM cells may be biased or floated during read operations (depending on the configuration of the read data line and the write data line). The read buffer in addressed and half-addressed SRAM cells may be biased or floated during write operations (depending on the configuration of the read data line and the write data line).

Figure 1:
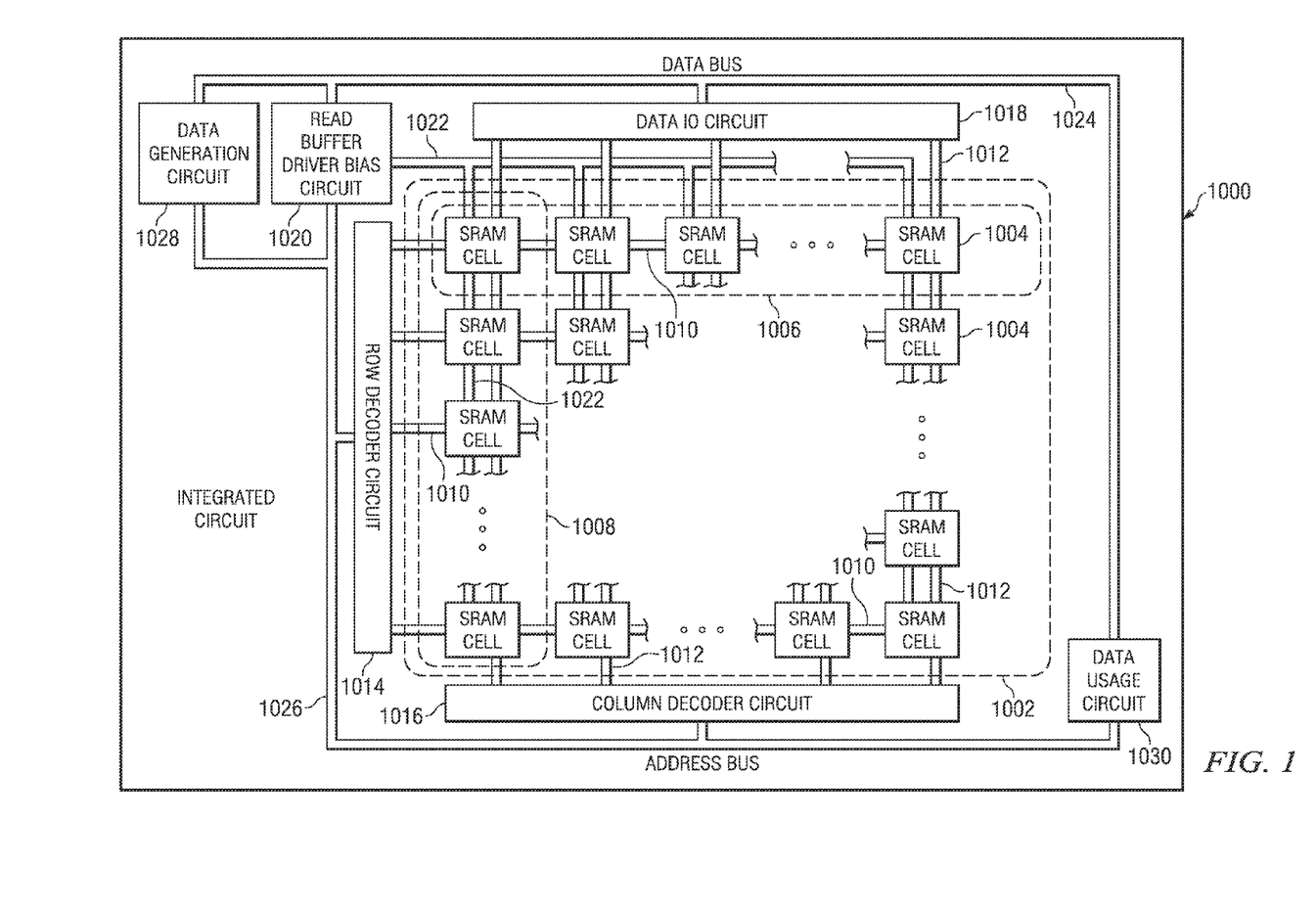
FIG. 1 depicts an integrated circuit containing an SRAM cell array which includes SRAM cells formed according to an embodiment.

FIG. 1 depicts an integrated circuit (1000) containing an SRAM cell array (1002) which includes SRAM cells (1004) formed according to an embodiment of the instant invention. The SRAM cells (1004) are arranged in rows (1006) and columns (1008). Each word line bus (1010) is connected to SRAM cells (1004) in a row (1006). Each word line bus (1010) may include more than one word line. Each bit line bus (1012) is connected to SRAM cells (1004) in a column (1008). Each bit line bus (1012) may include one or more bit or bit-bar lines. A row decoder circuit (1014) applies appropriate biases to word lines in the word line buses (1010). A column decoder circuit (1016) applies appropriate biases to bit or bit-bar lines in the bit line buses (1012). A data input/output (JO) circuit (1018) reads data from the bit or bit-bar lines in the bit line buses (1012) during read operations and applies appropriate potentials to the bit or bit-bar lines in the bit line buses (1012) during single sided write operations. An optional read buffer driver transistor bias circuit (1020) may apply biases to the read buffer driver bus (1022) which is connected to read buffer driver transistors in the SRAM cells (1004). The read buffer driver transistor bias circuit (1020) may be capable of biasing the read buffer driver transistors independently by column. The integrated circuit further includes a data bus (1024) which carries data bits between the SRAM cell array (1002) and other circuits (not shown) in the integrated circuit (1000), and an address bus (1026) which is used to select SRAM cells (1004) in the SRAM cell array (1002) for read and write operations. The address bus (1026) is connected to the row decoder circuit (1014), the column decoder circuit (1016) and the read buffer driver transistor bias circuit (1020). The integrated circuit (1000) may also contain a data generation circuit (1028) which connects to the data bus (1024) and address bus (1026). The data generation circuit (1028) produces incoming data bits for storage in the SRAM cell array (1002). The data bus (1024) carries the incoming data bits from the data generation circuit (1028) to the SRAM cell array (1002). The integrated circuit (1000) may also contain a data usage circuit (1030) which connects to the data bus (1024) and address bus (1026). The data usage circuit (1030) uses outgoing data bits which were stored in the SRAM cell array (1002). The data bus (1024) carries the outgoing data bits from the SRAM cell array (1002) to the data usage circuit (1030).

Figure 2:
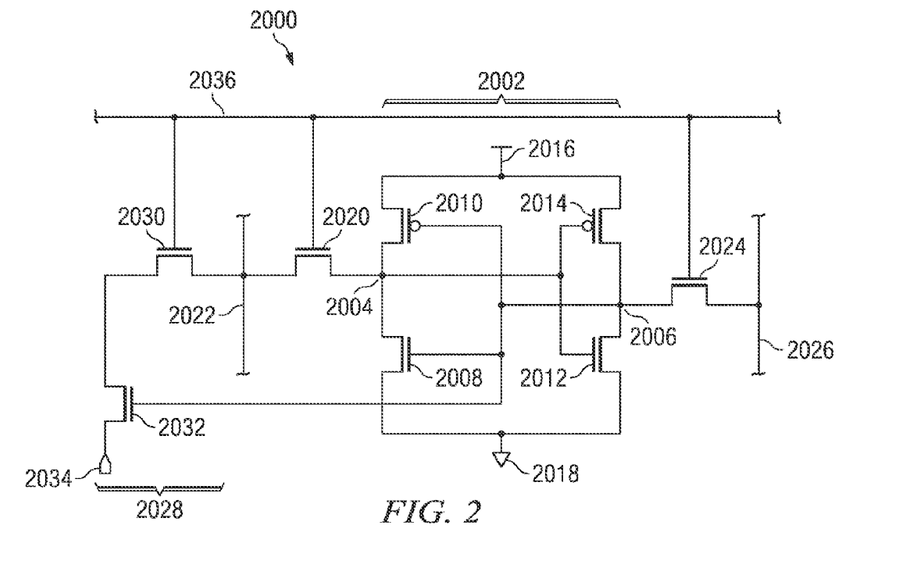
FIG. 2 is a circuit diagram of one SRAM cell in an SRAM cell array contained in an integrated circuit formed according to an embodiment.

FIG. 2 is a circuit diagram of one SRAM cell in an SRAM cell array contained in an integrated circuit formed according to a first embodiment. The SRAM cell (2000) contains a pair of cross-coupled inverters (2002) which includes a bit-side data node (2004) and a bit-bar-side data node (2006). The cross-coupled inverters (2002) further include an NMOS bit-side driver transistor (2008), a PMOS bit-side load transistor (2010), an NMOS bit-bar-side driver transistor (2012) and a PMOS bit-bar-side load transistor (2014). Gate nodes of the bit-side driver transistor (2008) and the bit-side load transistor (2010) are connected to the bit-bar-side data node (2006), and gate nodes of the bit-bar-side driver transistor (2012) and the bit-bar-side load transistor (2014) are connected to the bit-side data node (2004). Source nodes of the bit-side load transistor (2010) and the bit-bar-side load transistor (2014) are connected to an SRAM array Vdd node (2016). Source nodes of the bit-side driver transistor (2008) and the bit-bar-side driver transistor (2012) are connected to an SRAM array Vss node (2018).

The SRAM cell (2000) further includes an NMOS bit-side passgate transistor (2020). A first source/drain node of the bit-side passgate transistor (2020) is connected to the bit-side data node (2004). A second source/drain node of the bit-side passgate transistor (2020) is connected to a bit data line (2022). The SRAM cell (2000) also includes an NMOS bit-bar-side passgate transistor (2024). A first source/drain node of the bit-bar-side passgate transistor (2024) is connected to the bit-bar-side data node (2006). A second source/drain node of the bit-bar-side passgate transistor (2024) is connected to a bit-bar data line (2026).

The SRAM cell (2000) further includes a read buffer (2028), which includes an NMOS access transistor (2030) and an NMOS read buffer driver transistor (2032). A first source/drain node of the access transistor (2030) is connected to the bit data line (2022). A second source/drain node of the access transistor (2030) is connected to a drain node of the read buffer driver transistor (2032). A source node (2034) of the read buffer driver transistor (2032) may be connected to the SRAM array Vss node (2018), or may be connected to a read buffer driver transistor bias circuit.

Gate nodes of the bit-side passgate transistor (2020), the bit-bar-side passgate transistor (2024) and the access transistor (2030) are connected to a word line (2036). During a read operation or a write operation, an appropriate potential is applied to the word line (2036), for example, a potential substantially equal to Vdd, which turns on the bit-side passgate transistor (2020), the bit-bar-side passgate transistor (2024) and the access transistor (2030).

In an embodiment, a threshold voltage of the access transistor (2030) may be lower than a threshold voltage of the bit-side passgate transistor (2020) (for example, at least 50 millivolts lower), which may reduce data upsets in addressed cells during read operations in which the bit-side data node (2004) is substantially equal to the SRAM array Vss potential (as compared to SRAM cells in which threshold voltages of an access transistor and a bit-side passgate transistor are substantially equal). In another embodiment, a ratio of an on-state current of the bit-bar-side driver transistor (2012) to an on-state current of the bit-bar-side passgate transistor (2024) may be greater than a ratio of an on-state current of the bit-side driver transistor (2008) to an on-state current of the bit-side passgate transistor (2020) (for example, 20 percent greater), which may reduce data upsets in addressed cells during read operations in which the bit-side data node (2004) is substantially equal to the SRAM array Vdd potential (as compared to SRAM cells in which the ratios are substantially equal).

Figures 3A, 3B:
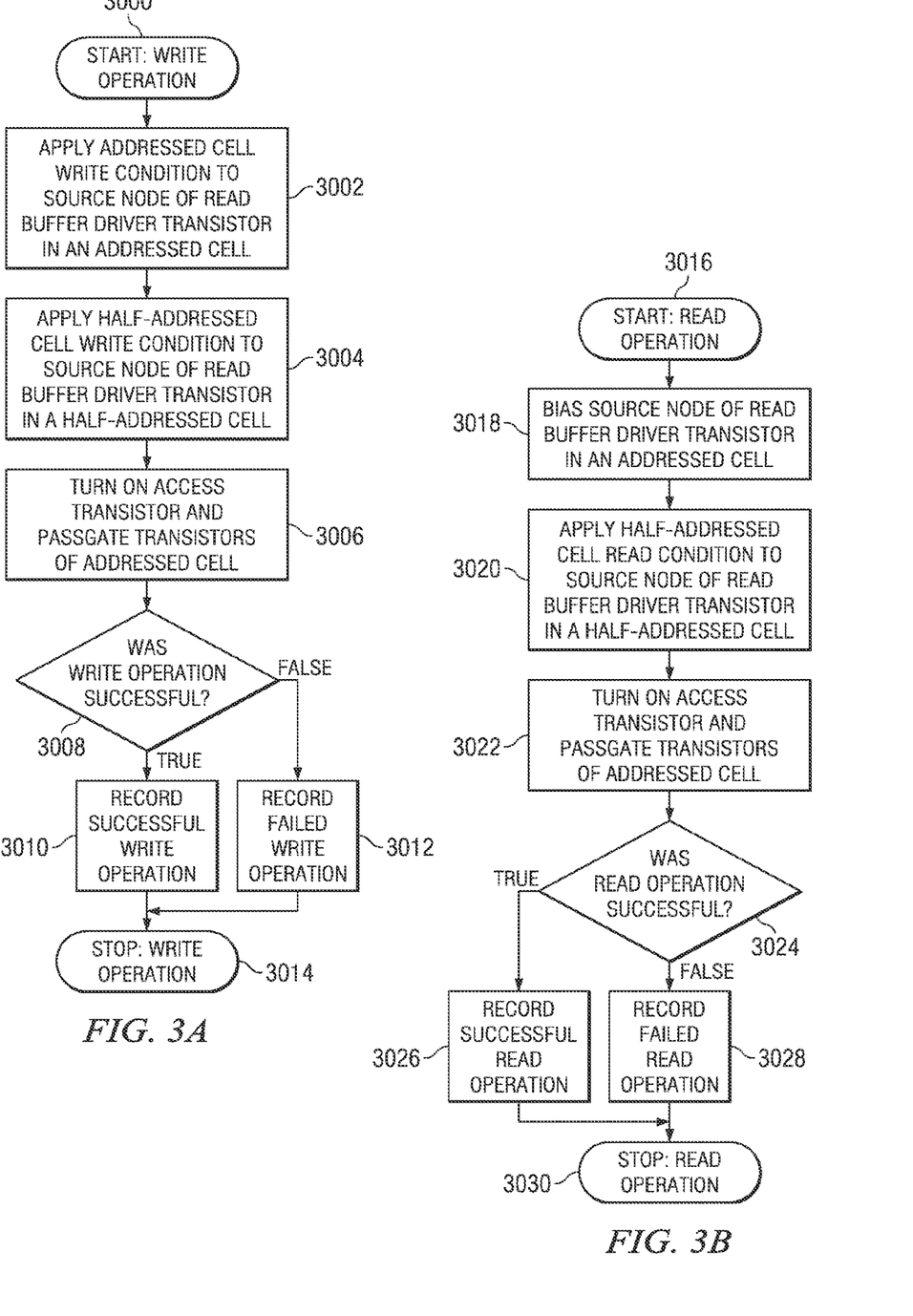
FIG. 3A through FIG. 3B are flowcharts of a write operation and a read operation, respectively.

FIG. 3A and FIG. 3B are flowcharts of a write operation and a read operation, respectively. The flowcharts in FIG. 3A and FIG. 3B refer to an SRAM cell (2000) as depicted in FIG. 2. Referring to FIG. 3A, the write operation begins (3000) with step (3002) which is to apply an addressed cell write condition to a source node (2034) of a read buffer driver transistor (2032) in an addressed SRAM cell (2000). This may mean floating the source node (2034) or biasing the source node (2034) to a voltage which provides write margin (for example Vss in a write low operation or Vdd in a write high operation).

Step (3004) is to apply a half-addressed cell write condition to the source node (2034) of a read buffer driver transistor (2032) in a half-addressed SRAM cell (2000). This may entail floating the source node (2034) or biasing the source node (2034) to a voltage which provides data stability (for example, a potential less than Vss plus Vtn). Step (3006) is to turn on an access transistor (2030) and both passgate transistors (2020, 2024) in the addressed SRAM cell (2000). In embodiments of the write operation which are part of test operations, following execution of step (3006), step (3008) is executed, which is to determine if write data potentials were successfully transferred from a bit data line (2022) and a bit-bar data line (2026) to a bit-side data node (2004) and a bit-bar-side data node (2006), respectively, in the addressed SRAM cell (2000) and to determine if there was a data upset in the half-addressed SRAM cell. If the write data potentials were successfully transferred and there was no data upset then step (3010) is executed, which is to record a successful write operation for the addressed SRAM cell (2000). If the write data potentials were not successfully transferred or there was a data upset then step (3012) is executed, which is to record a failed write operation for the addressed SRAM cell (2000). After step (3010) or step (3012) is executed, or after step (3006) is executed in embodiments which are not part of test operations, the write operation is ended (3014). In other embodiments of the single sided write bit-side low operation, steps (3002) and (3004) may be performed in any order.

Referring to FIG. 3B, the read operation (3016) begins with step (3018) which is to bias the source node (2034) of the read buffer driver transistor (2032) in the addressed SRAM cell (2000) to a low voltage (for example, Vss or Vss plus Vtn). Step (3020) is to apply a half-addressed cell read condition to the source node (2034) of the read buffer driver transistor (2032) in the half-addressed SRAM cell (2000). This may entail floating the source node (2034) or biasing the source node (2034) to a voltage which provides data stability (for example, Vss or Vss plus Vtn). Step (3022) is to turn on the access transistor (2030) and both passgate transistors (2020, 2024) in the addressed SRAM cell (2000). In embodiments of the read operation which are part of test operations, following execution of step (3022), step (3024) is executed, which is to determine if a data potential was successfully transferred from coupled inverters to a bit data line (2022) in the addressed SRAM cell (2000) and to determine if there was a data upset in the half-addressed SRAM cell. If the data potential was successfully transferred and there was no data upset then step (3026) is executed, which is to record a successful read operation for the addressed SRAM cell (2000). If the data potential was not successfully transferred or there was a data upset then step (3028) is executed, which is to record a failed read operation for the addressed SRAM cell (2000). After step (3026) or step (3028) is executed, or after step (3022) is executed in embodiments which are not part of test operations, the read operation is ended (3030). In other embodiments of the read operation, steps (3018) and (3020) may be performed in any order.

Figure 4:
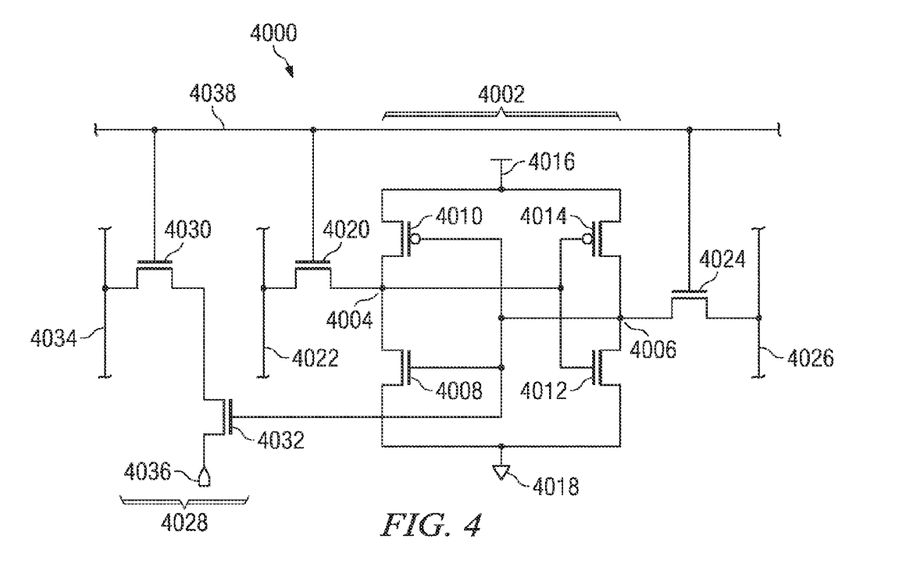
FIG. 4 is a circuit diagram of one SRAM cell in an SRAM cell array contained in an integrated circuit formed according to an embodiment.

FIG. 4 is a circuit diagram of one SRAM cell in an SRAM cell array contained in an integrated circuit formed according to a second embodiment. The SRAM cell (4000) contains a pair of cross-coupled inverters (4002) which includes a bit-side data node (4004) and a bit-bar-side data node (4006), a bit-side driver transistor (4008), a bit-side load transistor (4010), a bit-bar-side driver transistor (4012) and a bit-bar-side load transistor (4014), an SRAM array Vdd node (4016) and an SRAM array Vss node (4018), configured as described in reference to FIG. 2.

The SRAM cell (4000) further includes an NMOS bit-side passgate transistor (4020). A first source/drain node of the bit-side passgate transistor (4020) is connected to the bit-side data node (4004). A second source/drain node of the bit-side passgate transistor (4020) is connected to a bit data line (4022). The SRAM cell (4000) also includes an NMOS bit-bar-side passgate transistor (4024). A first source/drain node of the bit-bar-side passgate transistor (4024) is connected to the bit-bar-side data node (4006). A second source/drain node of the bit-bar-side passgate transistor (4024) is connected to a bit-bar data line (4026).

The SRAM cell (4000) further includes a read buffer (4028), which includes an NMOS access transistor (4030) and an NMOS read buffer driver transistor (4032). A first source/drain node of the access transistor (4030) is connected to a bit read line (4034). A second source/drain node of the access transistor (4030) is connected to a drain node of the read buffer driver transistor (4032). A source node (4036) of the read buffer driver transistor (4032) may be connected to the SRAM array Vss node (4018), or may be connected to a read buffer driver transistor bias circuit.

Gate nodes of the bit-side passgate transistor (4020), the bit-bar-side passgate transistor (4024) and the access transistor (4030) are connected to a word line (4038). During a read operation or a write operation, an appropriate potential is applied to the word line (4038) (for example, a potential substantially equal to Vdd) which turns on the bit-side passgate transistor (4020), the bit-bar-side passgate transistor (4024) and the access transistor (4030).

Figure 5:
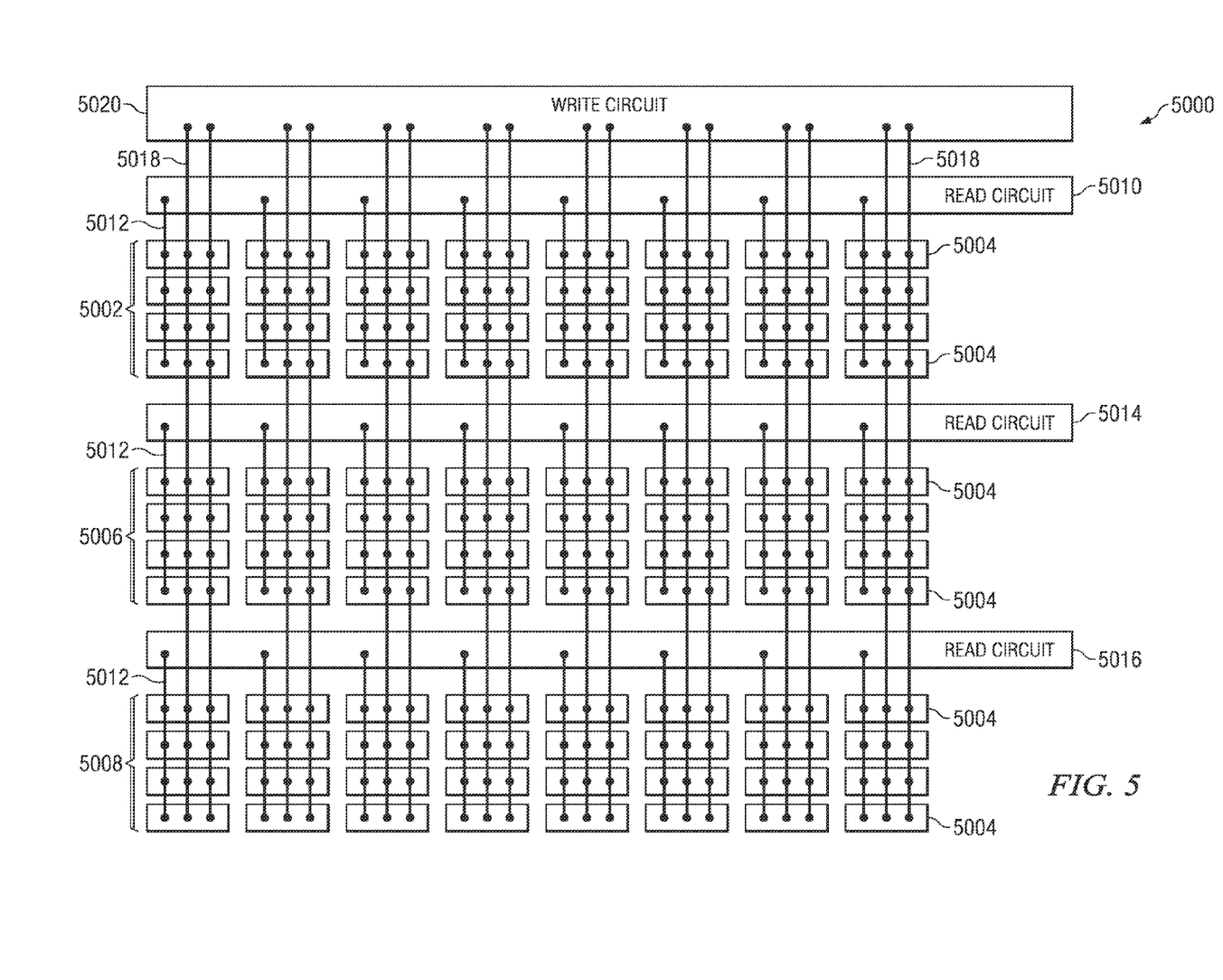
FIG. 5 is a schematic of an SRAM cell array with shorter read line than write lines, formed according to an embodiment.

In some integrated circuits, it may be desirable to perform read operations more quickly than write operations while maintaining desired average cell densities in SRAM cell arrays including read and write circuitry. Providing separate read lines and write lines as described in reference to FIG. 4 may enable SRAM array configurations which have shorter read lines than write lines (which may allow desired speeds for read operations and write operations while maintaining desired average cell densities). FIG. 5 is a schematic of an SRAM cell array with shorter read line than write lines, formed according to one embodiment. The SRAM cell array (5000) includes a first cell block (5002) of SRAM cells (5004), a second cell block (5006) of SRAM cells (5004), and a third cell block (5008) of SRAM cells (5004). A first read circuit (5010) is located proximate to the first cell block (5002). Read lines (5012) extend from the first read circuit (5010) to SRAM cells (5004) in the first cell block (5002). Similarly, read lines (5012) extend from a second read circuit (5014), located proximate to the second cell block (5006), to SRAM cells (5004) in the second cell block (5006), and from a third read circuit (5016), located proximate to the third cell block (5008), to SRAM cells (5004) in the third cell block (5008). Write lines (5018) extend from a write circuit (5020) to SRAM cells (5004) in the first cell block (5002), the second cell block (5006), and the third cell block (5008).

Figures 6A, 6B:
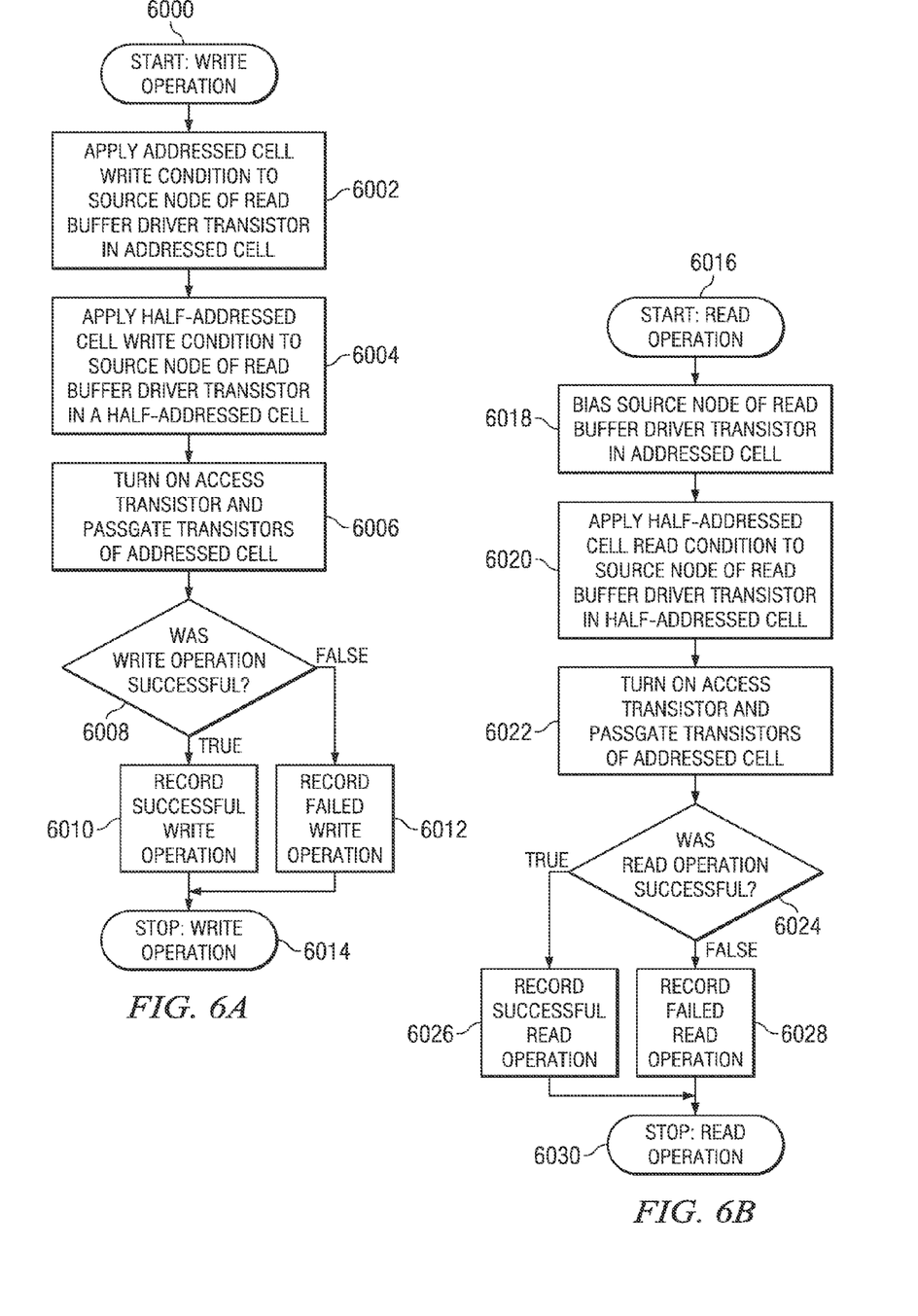
FIG. 6A and FIG. 6B are flowcharts of a write operation and a read operation, respectively.

FIG. 6A and FIG. 6B are flowcharts of a write operation and a read operation, respectively. The flowcharts in FIG. 6A and FIG. 6B refer to an SRAM cell (4000) as depicted in FIG. 4. Referring to FIG. 6A, the write operation begins (6000) with step (6002) which is to apply an addressed cell write condition to a source node (4036) of a read buffer driver transistor (4032) in an addressed SRAM cell (4000). In one embodiment, the source node (4036) may be floated to possibly reduce leakage current in the addressed SRAM cell (4000). In another embodiment, the source node (4036) may be biased to a low voltage (for example, a potential less than Vss plus Vtn), to possibly limit charge accumulation on a bit read line (4034) attached to the read buffer driver transistor (4032) in the addressed SRAM cell (4000).

Step (6004) is to apply a half-addressed cell write condition to a source node (4036) of a read buffer driver transistor (4032) in a half-addressed SRAM cell (4000). In one embodiment, the source node (4036) may be floated to possibly reduce leakage current in the half-addressed SRAM cell (4000). In another embodiment, the source node (4036) may be biased to a low voltage (for example, a potential less than Vss plus Vtn), to possibly limit charge accumulation on a bit read line (4034) attached to the read buffer access transistor (4030) in the half-addressed SRAM cell (4000).

Step (6006) is to turn on an access transistor (4030) and both passgate transistors (4020) and (4024) in the addressed SRAM cell (4000). In embodiments of the write operation which are part of test operations, following execution of step (6006), step (6008) is executed, which is to determine if write data potentials were successfully transferred from a bit data line (4022) and a bit-bar data line (4026) to a bit-side data node (4004) and a bit-bar-side data node (4006), respectively, in the addressed SRAM cell (4000) and to determine if there was a data upset in the half-addressed SRAM cell (4000). If the write data potentials were successfully transferred to the bit-side data node (4004) and the bit-bar-side data node (4006) and there was no data upset then step (6010) is executed, which is to record a successful write operation for the addressed SRAM cell (4000). If the write data potentials were not successfully transferred or there was a data upset then step (6012) is executed, which is to record a failed write operation for the addressed SRAM cell (4000). After step (6010) or step (6012) is executed, or after step (6006) is executed in embodiments which are not part of test operations, the write operation is ended (6014). In other embodiments of the write operation, steps (6002) and (6004) may be performed in any order.

Referring to FIG. 6B, the read operation (6016) begins with step (6018) which is to bias the source node (4036) of the read buffer driver transistor (4032) in the addressed SRAM cell (4000) to a low voltage (for example, Vss or Vss plus Vtn).

Step (6020) is to apply a half-addressed cell read condition to the source node (4036) of the read buffer driver transistor (4032) in the half-addressed SRAM cell (4000). In one embodiment, the source node (4036) may be floated to possibly reduce leakage current in the half-addressed SRAM cell (4000). In another embodiment, the source node (4036) may be biased to a low voltage (for example, a potential less than Vss plus Vtn), to possibly limit charge accumulation on the bit read line (4034) attached to the read buffer access transistor (4030) in the half-addressed SRAM cell (4000).

Step (6022) is to turn on the access transistor (4030) and both passgate transistors (4020) and (4024) in the addressed SRAM cell (4000). In embodiments of the read operation which are part of test operations, following execution of step (6022), step (6024) is executed, which is to determine if a data potential was successfully transferred from a bit-side data node (4004) and a bit-bar-side data node (4006) to the bit read line (4034) in the addressed SRAM cell (4000) and to determine if there was a data upset in the half-addressed SRAM cell (4000). If the data potential was successfully transferred and there was no data upset, step (6026) is executed, which is to record a successful read operation for the addressed SRAM cell (4000). If the data potential was not successfully transferred or there was a data upset, step (6028) is executed, which is to record a failed read operation for the addressed SRAM cell (4000). After step (6026) or step (6028) is executed, or after step (6022) is executed in embodiments which are not part of test operations, the read operation is ended (6030). In other embodiments of the read operation, steps (6018) and (6020) may be performed in any order.

Figure 7:
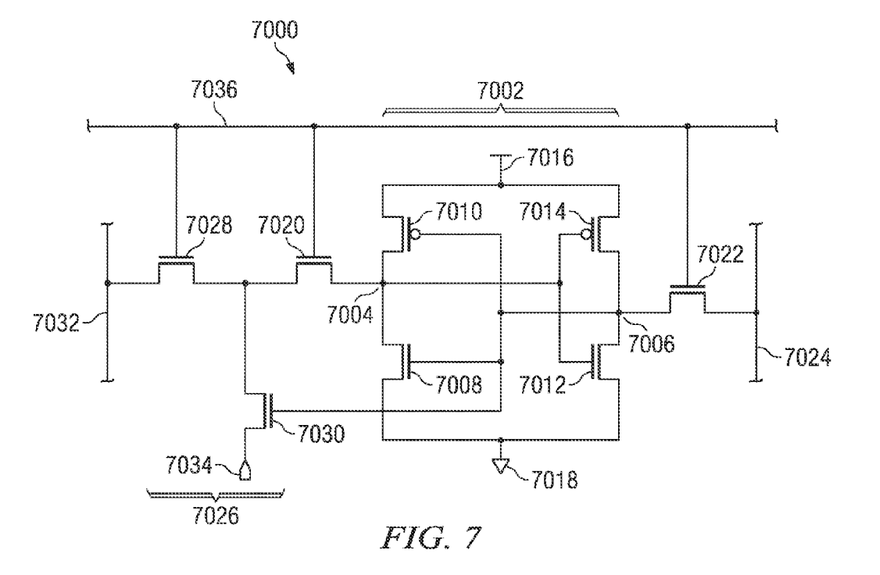
FIG. 7 is a circuit diagram of one SRAM cell in an SRAM cell array contained in an integrated circuit formed according to an embodiment.

FIG. 7 is a circuit diagram of one SRAM cell in an SRAM cell array contained in an integrated circuit formed according to a third embodiment. The SRAM cell (7000) contains a pair of cross-coupled inverters (7002) which includes a bit-side data node (7004) and a bit-bar-side data node (7006), a bit-side driver transistor (7008), a bit-side load transistor (7010), a bit-bar-side driver transistor (7012) and a bit-bar-side load transistor (7014), an SRAM array Vdd node (7016) and an SRAM array Vss node (7018), configured as described in reference to FIG. 2.

The SRAM cell (7000) further includes an NMOS bit-side passgate transistor (7020). A first source/drain node of the bit-side passgate transistor (7020) is connected to the bit-side data node (7004). The SRAM cell (7000) also includes an NMOS bit-bar-side passgate transistor (7022). A first source/drain node of the bit-bar-side passgate transistor (7022) is connected to the bit-bar-side data node (7006). A second source/drain node of the bit-bar-side passgate transistor (7022) is connected to a bit-bar data line (7024).

The SRAM cell (7000) further includes a read buffer (7026), which includes an NMOS access transistor (7028) and an NMOS read buffer driver transistor (7030). A first source/drain node of the access transistor (7028) is connected to a bit data line (7032). A second source/drain node of the access transistor (7028) is connected to a drain node of the read buffer driver transistor (7030) and to a second source/drain node of the bit-side passgate transistor (7020). A source node (7034) of the read buffer driver transistor (7030) may be connected to the SRAM array Vss node (7018), or may be connected to a read buffer driver transistor bias circuit (such as the read buffer driver transistor bias circuit (1020) of FIG. 1).

The gate nodes of the bit-side passgate transistor (7020), the bit-bar-side passgate transistor (7022) and the access transistor (7028) are connected to a word line (7036). During a read operation or a write operation, an appropriate potential is applied to the word line (7036) (for example, a potential substantially equal to Vdd), which turns on the bit-side passgate transistor (7020), the bit-bar-side passgate transistor (7022) and the access transistor (7028).

During a read operation or a write operation, the source nodes of the read buffer driver transistors in half-addressed SRAM cells may be biased to possibly reduce data upsets. During a write operation, the source nodes of the read buffer driver transistors in addressed SRAM cells may be floated to possibly reduce leakage currents in the read buffers and to possibly improve trip voltage values in the addressed SRAM cells. During a read operation, the source nodes of the read buffer driver transistors in addressed SRAM cells may be biased to a low voltage (for example, a potential less than Vss plus Vtn) to provide read current to the bit read lines. During a transition to standby mode, the source nodes of the read buffer driver transistors in SRAM cells may be floated to possibly reduce leakage currents in the read buffers (as described in reference to FIG. 2 and FIG. 3C). In one embodiment, a ratio of an on-state current of the bit-bar-side driver transistor (7012) to an on-state current of the bit-bar-side passgate transistor (7022) may be greater than a ratio of an on-state current of the bit-side driver transistor (7008) to an on-state current of the bit-side passgate transistor (7020) (for example 20 percent greater), which may reduce data upsets in addressed cells during read operations in which the bit-side data node (7004) is substantially equal to the SRAM array Vdd potential (as compared to SRAM cells in which the ratios are substantially equal).

Figures 8A, 8B:
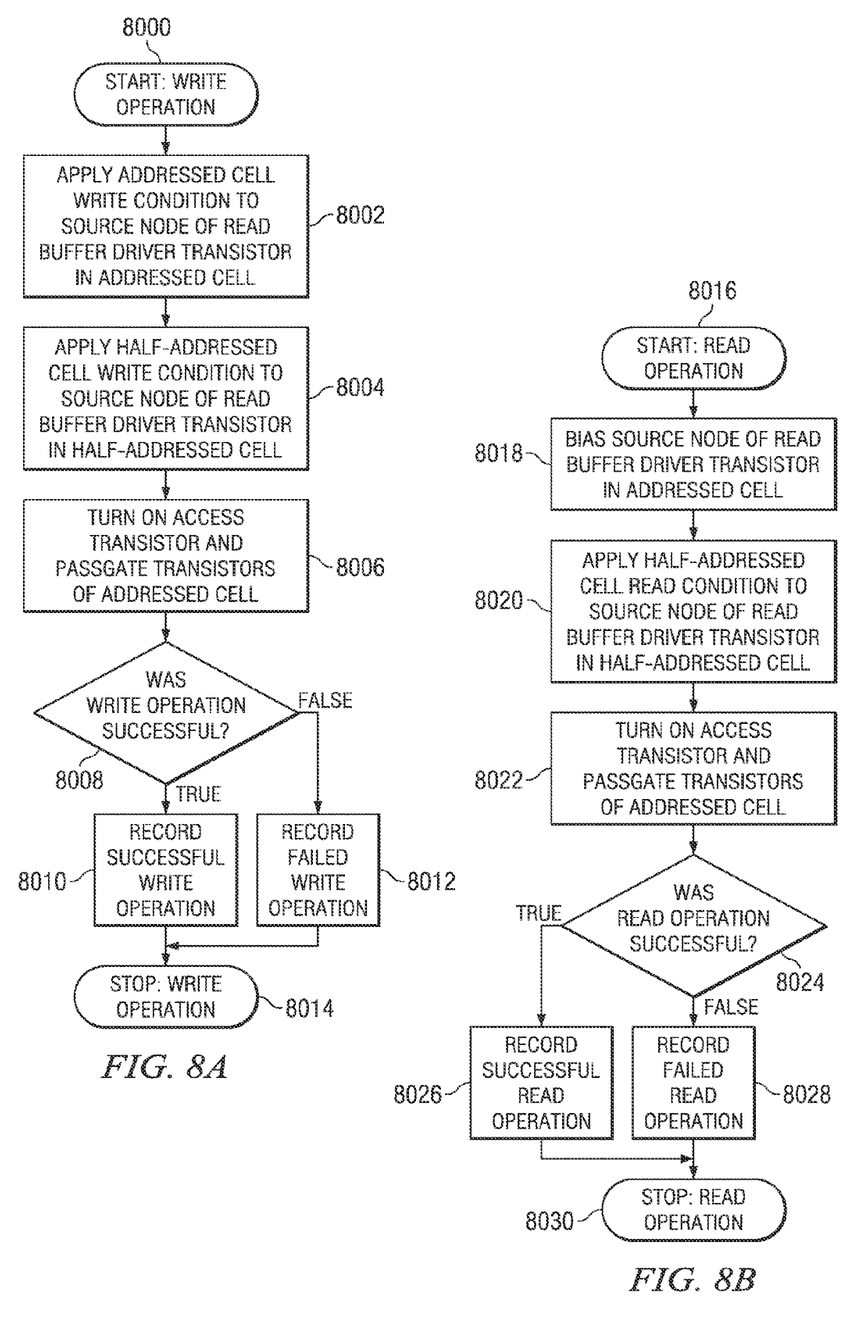
FIG. 8A and FIG. 8B are flowcharts of a write operation and a read operation, respectively.

FIG. 8A and FIG. 8B are flowcharts of a write operation and a read operation, respectively. The flowcharts in FIG. 8A and FIG. 8B refer to an SRAM cell as depicted in FIG. 7. Retelling to FIG. 8A, the write operation begins (8000) with step (8002) which is to apply an addressed cell write condition to a source node of a read buffer driver transistor in an addressed SRAM cell. In one embodiment, the source node may be floated. In another embodiment, the source node may be biased to a voltage which provides write margin (for example, Vss in a write low operation or Vdd in a write high operation).

Step (8004) is to apply a half-addressed cell write condition to a source node of a read buffer driver transistor in a half-addressed SRAM cell. In one embodiment, the source node may be biased to a low voltage (for example, a potential less than Vss plus Vtn). In another embodiment, the source node may be floated.

Step (8006) is to turn on an access transistor and both passgate transistors in the addressed SRAM cell. In embodiments of the write operation which are part of test operations, following execution of step (8006), step (8008) is executed, which is to determine if write data potentials were successfully transferred from a bit data line and a bit-bar data line to a bit-side data node and a bit-bar-side data node, respectively, in the addressed SRAM cell and to determine if there was a data upset in the half-addressed SRAM cell. If the write data potentials were successfully transferred to the bit-side data node and the bit-bar-side data node and there was no data upset then step (8010) is executed, which is to record a successful write operation for the addressed SRAM cell. If the write data potentials were not successfully transferred or there was a data upset then step (8012) is executed, which is to record a failed write operation for the addressed SRAM cell. After step (8010) or step (8012) is executed, or after step (8006) is executed in embodiments which are not part of test operations, the write operation is ended (8014). In other embodiments of the single sided write bit-side low operation, steps (8002) and (8004) may be performed in any order.

Referring to FIG. 8B, the read operation (8016) begins with step (8018) which is to bias a source node of a read buffer driver transistor in an addressed SRAM cell to a low voltage (for example, Vss or Vss plus Vtn). Step (8020) is to apply a half-addressed cell read condition to a source node of a read buffer driver transistor in a half-addressed SRAM cell. In one embodiment, the source node may be biased to a low voltage (for example, Vss or Vss plus Vtn). In another embodiment, the source node may be floated.

Step (8022) is to turn on an access transistor and both passgate transistors in the addressed SRAM cell. In embodiments of the read operation which are part of test operations, following execution of step (8022), step (8024) is executed, which is to determine if a data potential was successfully transferred from coupled inverters to a bit data line in the addressed SRAM cell and to determine if there was a data upset in the half-addressed SRAM cell. If the data potential was successfully transferred to the bit data line and there was no data upset the step (8026) is executed, which is to record a successful read operation for the addressed SRAM cell. If the data potential was not successfully transferred to the bit data line or there was a data upset then step (8028) is executed, which is to record a failed read operation for the addressed SRAM cell. After step (8026) or step (8028) is executed, or after step (8022) is executed in embodiments which are not part of test operations, the read operation is ended (8030). In other embodiments of the read operation, steps (8018) and (8020) may be performed in any order.

Figure 9:
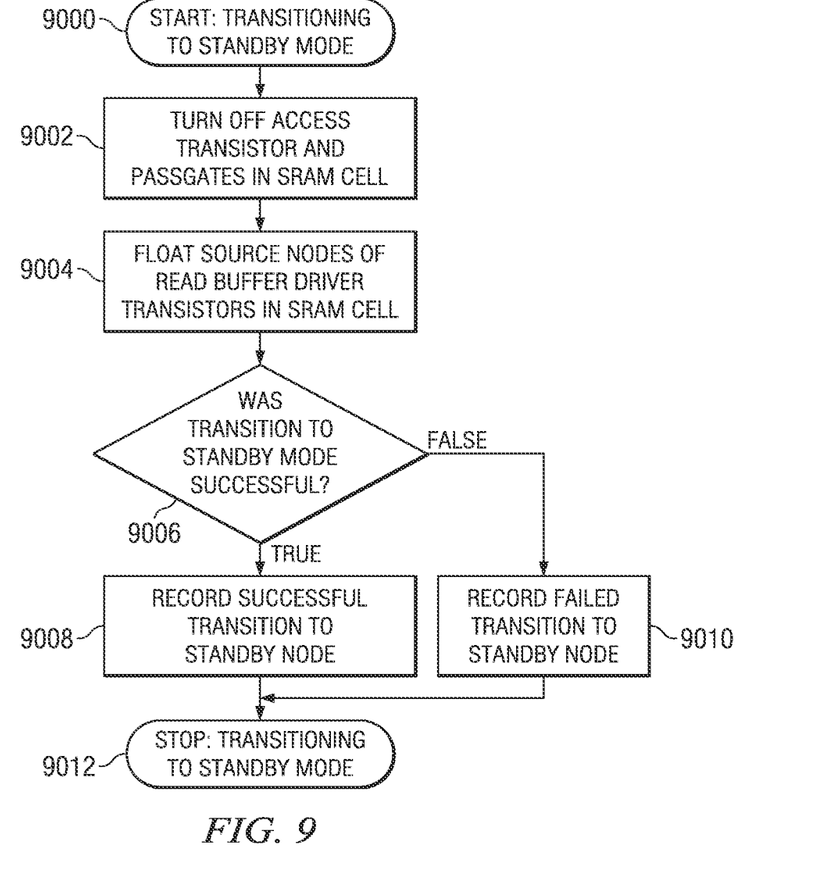
FIG. 9 is a flowchart of transitioning to standby mode.

FIG. 9 is a flowchart of transitioning to standby mode. The flowchart in FIG. 9 refers to SRAM cells as depicted in FIG. 2, FIG. 4 and FIG. 7. In a standby mode, no write or read operations are performed, while bias levels to source nodes of driver and load transistors in SRAM cells are maintained at substantially the same levels as are applied during write and read operations (to enable rapid transition from standby mode to write or read operations). Transitioning to standby mode (9000) begins with step (9002) which is to turn off an access transistor in a read buffer in an SRAM cell and bit-side and bit-bar-side passgate transistors in the SRAM cell, through a word line connected to a gate of the access transistor and to gates of the bit-side and bit-bar-side passgate transistors. Step (9004) is to float a source node of a read buffer driver transistor in the SRAM cell. In embodiments of the transition to standby mode which are part of test operations (such as measurements of leakage currents in SRAM cell arrays), following execution of step (9004), step (9006) is executed, which is to determine if the transitioning to standby mode was successful (for example, if leakage currents were below target values). If the transition to standby mode was successful then step (9008) is executed, which is to record a successful transition to standby mode operation for the SRAM cell. If the transition to standby mode was not successful then step (9010) is executed, which is to record a failed transition to standby mode operation for the SRAM cell. After step (9008) or step (9010) is executed, or after step (9004) is executed in embodiments which are not part of test operations, the transition to standby mode operation is ended (9012).

Figure 10:
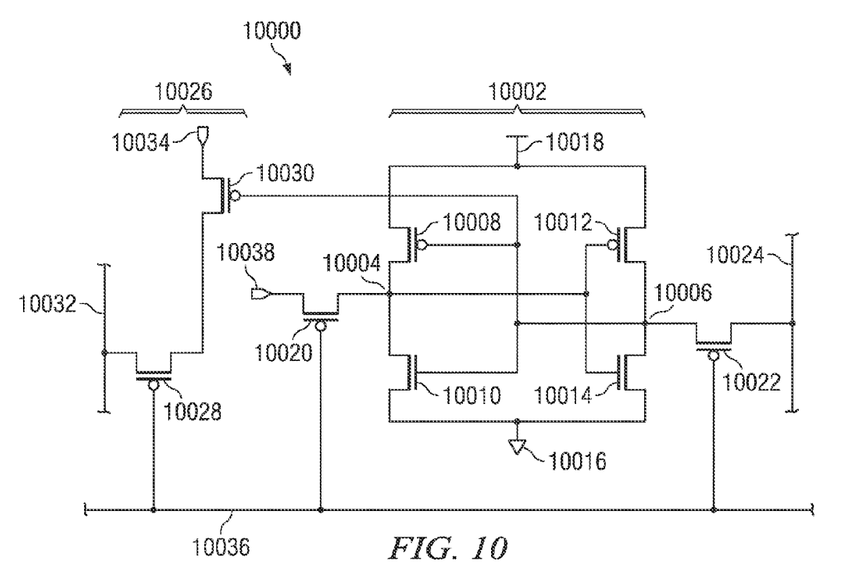
FIG. 10 is a circuit diagram of an SRAM cell in an SRAM cell array formed according to an embodiment with transistors of reversed polarity from the embodiments depicted in FIG. 2, FIG. 4 and FIG. 7.

It is to be noted that the SRAM cells as described in reference to FIG. 2, FIG. 4 and FIG. 7 may instead be formed with PMOS driver transistors and NMOS load transistors in the cross-coupled inverters, PMOS passgate transistors, PMOS access transistors and PMOS read buffer driver transistors. For example, FIG. 10 is a circuit diagram of an SRAM cell in an SRAM cell array formed according to an embodiment having transistors of reversed polarity from the embodiments depicted in FIG. 2, FIG. 4 and FIG. 7. The SRAM cell (10000) contains a pair of cross-coupled inverters (10002) which includes a bit-side data node (10004) and a bit-bar-side data node (10006). The cross-coupled inverters (10002) further include a PMOS bit-side driver transistor (10008), an NMOS bit-side load transistor (10010), a PMOS bit-bar-side driver transistor (10012) and an NMOS bit-bar-side load transistor (10014). Gate nodes of the bit-side driver transistor (10008) and the bit-side load transistor (10010) are connected to the bit-bar-side data node (10006), and gate nodes of the bit-bar-side driver transistor (10012) and the bit-bar-side load transistor (10014) are connected to the bit-side data node (10004). Source nodes of the bit-side load transistor (10010) and the bit-bar-side load transistor (10014) are connected to an SRAM array Vss node (10016). Source nodes of the bit-side driver transistor (10008) and the bit-bar-side driver transistor (10012) are connected to an SRAM array Vdd node (10018).

The SRAM cell (10000) further includes a PMOS bit-side passgate transistor (10020). A first source/drain node of the bit-side passgate transistor (10020) is connected to the bit-side data node (10004). The SRAM cell (10000) also includes a bit-bar-side passgate transistor (10022). A first source/drain node of the bit-bar-side passgate transistor (10022) is connected to the bit-bar-side data node (10006). A second source/drain node of the bit-bar-side passgate transistor (10022) is connected to a bit-bar data line (10024).

The SRAM cell (10000) further includes a read buffer (10026), which includes an access transistor (10028) and a read buffer driver transistor (10030). A first source/drain node of the access transistor (10028) is connected to a bit data line (10032). A second source/drain node of the access transistor (10028) is connected to a drain node of the read buffer driver transistor (10030). A source node (10034) of the read buffer driver transistor (10030) may be connected to the SRAM array Vdd node (10018), or may be connected to a read buffer driver transistor bias circuit.

Gate nodes of the bit-side passgate transistor (10020), the bit-bar-side passgate transistor (10024) and the access transistor (10028) are connected to a word line (10036). During a read operation or a write operation, an appropriate potential is applied to the word line (10036) (for example, a potential substantially equal to Vss), which turns on the bit-side passgate transistor (10020), the bit-bar-side passgate transistor (10022) and the access transistor (10028).

In one embodiment, a second source/drain node (10038) of the bit-side passgate transistor (10020) may be connected to the bit data line (10032). In another embodiment, the second source/drain node (10038) of the bit-side passgate transistor (10020) may be connected to a second bit data line (not shown) separate from the bit data line (10032). In a further embodiment, the second source/drain node (10038) of the bit-side passgate transistor (10020) may be connected to the second source/drain node of the access transistor (10028). The possible benefits described in reference to the embodiments discussed in reference to FIG. 2, FIG. 4 and FIG. 7 may also be accrued to corresponding embodiments directed to the SRAM cell of FIG. 10.

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. A process of performing a write operation, comprising:
applying a voltage that provides write margin to a source node of a read buffer driver transistor in an addressed SRAM cell during said write operation; and
turning on an access transistor in said addressed SRAM cell that is connected to said read buffer driver transistor in said addressed SRAM cell, a bit-side passgate transistor in said addressed SRAM cell, and a bit-bar-side passgate transistor in said addressed SRAM cell through a single word line that is connected to a gate of said access transistor, a gate of said bit-side passgate transistor, and a gate of said bit-bar-side passgate transistor;
wherein a source/drain node of a bit-bar-side passgate transistor in said addressed SRAM cell is only connected to a bit-bar data line.

2. The process of claim 1, further including applying a half-addressed cell write condition to a source node of a read buffer driver transistor in a half-addressed SRAM cell.

3. The process of claim 2, in which a source/drain node of said bit-side passgate transistor in said addressed SRAM cell is connected to a source/drain node of said access transistor in said addressed SRAM cell plus a bit data line in said addressed SRAM cell.

4. The process of claim 2, in which a source/drain node of said bit-side passgate transistor in said addressed SRAM cell is connected to a bit data line, and a source/drain node of said access transistor in said addressed SRAM cell is connected to a bit read line in said addressed SRAM cell.

5. The process of claim 2, in which a source/drain node of said bit-side passgate transistor in said addressed SRAM cell is connected to a first source/drain node of said access transistor in said addressed SRAM cell, and a second source/drain node of said access transistor in said addressed SRAM cell is connected to a bit data line in said addressed SRAM cell.

* * * * *